United States Patent [19]
Crook et al.

[11] Patent Number: 5,898,325
[45] Date of Patent: Apr. 27, 1999

[54] DUAL TUNABLE DIRECT DIGITAL SYNTHESIZER WITH A FREQUENCY PROGRAMMABLE CLOCK AND METHOD OF TUNING

[75] Inventors: David T. Crook, Summerfield; Thomas E. Tice; James A. Surber, Jr., both of Greensboro, all of N.C.

[73] Assignee: Analog Devices, Inc., Norwood, Mass.

[21] Appl. No.: 08/895,717

[22] Filed: Jul. 17, 1997

[51] Int. Cl.$^6$ .............................. H03L 7/18; H03B 21/00
[52] U.S. Cl. ..................... 327/105; 327/106; 327/113; 327/116; 327/119; 364/718; 364/721
[58] Field of Search ........................... 327/119, 105, 327/106, 107, 113, 116, 114; 364/718, 721; 375/354

[56] References Cited

U.S. PATENT DOCUMENTS 5,045,817 9/1991 Sheffer ........................... 375/44

OTHER PUBLICATIONS

"AN-237 Application Note", Analog Devices Brochure, 1992, pp. 1–11.
V. Manassevitsch, *Frequency Synthesizers Theory and Design*, Wiley Interscience 3$^{rd}$ Edition, 1987, pp. 31–33.
"CMOS, 125 MHz Complete DDS Synthesizer AD9850", Analog Devices Brochure, Dec. 1995, pp. 1–19.
"Radio Frequency Oscillators and Synethesizers", *ARRL Handbook*, American Radio Relay League, Chapter 10, 1993, pp. 10–17 though 10–23.
V. Manassevitsch, *Frequency Synthesizers Theory and Design*, Wiley Interscience 3$^{rd}$ Edition, 1987, pp. 37–43.
Behzad Razavi, "Design of Monolithic Phase–Locked Loops and Clock Recovery Circuits –A Tutorial", *IEEE Press*, 1996, pp. 1–7.
Garvey et al., "An Exact Spectral Analysis of a Number Controlled Oscillator Based Synthesizer", Forty–Fourth Annual Symposium on Frequency Control, 1990, pp. 511–521.

*Primary Examiner*—Timothy P. Callahan
*Assistant Examiner*—Dinh Le
*Attorney, Agent, or Firm*—Koppel & Jacobs

[57] ABSTRACT

A dual-tunable direct digital synthesizer is provided with a programmable frequency multiplier that multiplies a relatively low frequency fixed clock signal $F_{clk}$ so that the output frequency $F_o$ of the waveform is:

$$F_o = (F_n/2^N) \times (M \times F_{clk})$$

where N is the resolution of the digital control word, the tuning word $F_n$ is the value of the N-bit control word, M is the multiplication factor and $M*F_{clk}$ is the DDS clock frequency. The multiplication factor and, hence, the DDS clock can be reduced to track changes in the output frequency thereby lowering the average power consumption. Because the synthesizer can generate the same output frequency using different tuning word-to-DDS clock ratios, it can be tuned for optimum SFDR over a narrow band around the desired output frequency. In other words, an "enhanced dynamic range band" in the harmonic and spurious performance can be mapped out for each frequency in the bandwidth.

16 Claims, 4 Drawing Sheets

DUAL TUNABLE DIRECT DIGITAL SYNTHESIZER WITH A FREQUENCY PROGRAMMABLE CLOCK AND METHOD OF TUNING

BACKGROUND OF THE INVENTION

1. Field of the Invention

This invention relates to direct digital synthesis (DDS) and more specifically to a dual-tunable direct digital synthesizer with a frequency programmable clock and a method of tuning to reduce power consumption and/or spur noise.

2. Description of the Related Art

DDS is a technique for synthesizing, under digital control, a periodic analog waveform from a fixed reference clock signal. The waveform frequency $F_o$ is given by:

$$F_o = (F_n/2^N) \times F_{clk} \qquad (1)$$

where N is the resolution of the digital control word, the tuning word $F_n$ is the value of the N-bit control word and represents the phase increment, and $F_{clk}$ is the frequency of the reference clock signal. The reference clock frequency $F_{clk}$ must be at least twice the maximum waveform frequency $F_o$ to satisfy the Nyquist criterion, and, as a rule of thumb, is three to four times the maximum waveform frequency to shift the harmonically related spurs or aliased images away from the fundamental. Once the clock frequency is fixed, the tuning word $F_n$ uniquely determines the waveform frequency.

Garvey et al. "An Exact Spectral Analysis of a Number Controlled Oscillator Based Synthesizer," Fourty-Fourth Annual Symposium on Frequency Control, pp. 511-521, 1990 and V. Manassevitsch, *Frequency Synthesizers Theory and Design*, Wiley Interscience 3$^{rd}$ Edition, pp. 37-43, 1987 describe the well known DDS architecture. A stable crystal-controlled oscillator generates the fixed frequency reference clock signal $F_{clk}$ while a frequency tuner outputs the tuning word $F_n$, which sets the step-size of a programmable phase accumulator. At each clock cycle, the accumulator output represents the instantaneous phase of the periodic analog waveform. The phase is then converted to a periodic digital waveform either by direct computation or by using a look-up table (LUT). A DAC converts the digital waveform into the desired analog waveform, which is passed through a low pass filter to remove the aliased components induced by the sampling process and the higher order harmonics.

In effect, a DDS system divides the reference clock signal down in frequency by some number $K=2^N/F_n$ greater than 2 and converts it to a desired waveform. Dividing down the frequency in this manner provides extremely fine frequency resolution, fast frequency switching, and reduces the phase noise in the waveform by 20 $\log_{10}K$. Although generally superior to other synthesis techniques in frequency resolution and update capabilities, DDS high frequency operation, power consumption and spurious noise performance bear improvement.

Specifically, high frequency operation is currently impractical due to the cost of providing a very high frequency reference clock signal, the noise coupling associated with running the high frequency clock signal across the circuit board, and the power consumption. The reference clock signal consumes power at the level required to generate the maximum waveform frequency, regardless of the actual waveform frequency. Finally, the quantization level errors inherent in a DDS process produce a different spurious noise pattern for each tuning word value, which can be further degraded by any nonlinearities in the DAC. The spur patterns exhibit narrow frequency bands or "enhanced dynamic range bands" at which the synthesizer's Spurious Free Dynamic Range (SFDR) meets the noise specifications for the output waveform. As a result, known DDS systems are constrained to generate output frequencies that lie only inside these enhanced dynamic range bands or tolerate a reduced SFDR. This seriously comprises the flexibility and performance of known systems.

SUMMARY OF THE INVENTION

In view of the above problems, the present invention provides a dual-tunable direct digital synthesizer having lower average power consumption and improved output frequency tuning flexibility in terms of providing enhanced spurious performance.

This is accomplished by providing a direct digital synthesizer with a programmable frequency multiplier that multiplies a relatively low frequency fixed clock signal $F_{clk}$ so that the output frequency $F_o$ of the waveform is:

$$F_o = (F_n/2^N) \times (M \times F_{clk})$$

where N is the resolution of the digital control word, the tuning word $F_n$ is the value of the N-bit control word, M is the multiplication factor and $M \ast F_{clk}$ is the DDS clock frequency. This approach avoids the expense and noise coupling associated with a high frequency clock, which increases the synthesizer's available bandwidth. The multiplication factor and, hence, the DDS clock can be reduced to track changes in the output frequency thereby lowering the average power consumption. Because the synthesizer can generate the same output frequency using different tuning word-to-DDS clock ratios, it can be tuned for optimum SFDR over a narrow band around the desired output frequency. In other words, an "enhanced dynamic range band" in the harmonic and spurious performance can be mapped out for each frequency in the bandwidth by dual tuning of the multiplication factor and tuning word.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
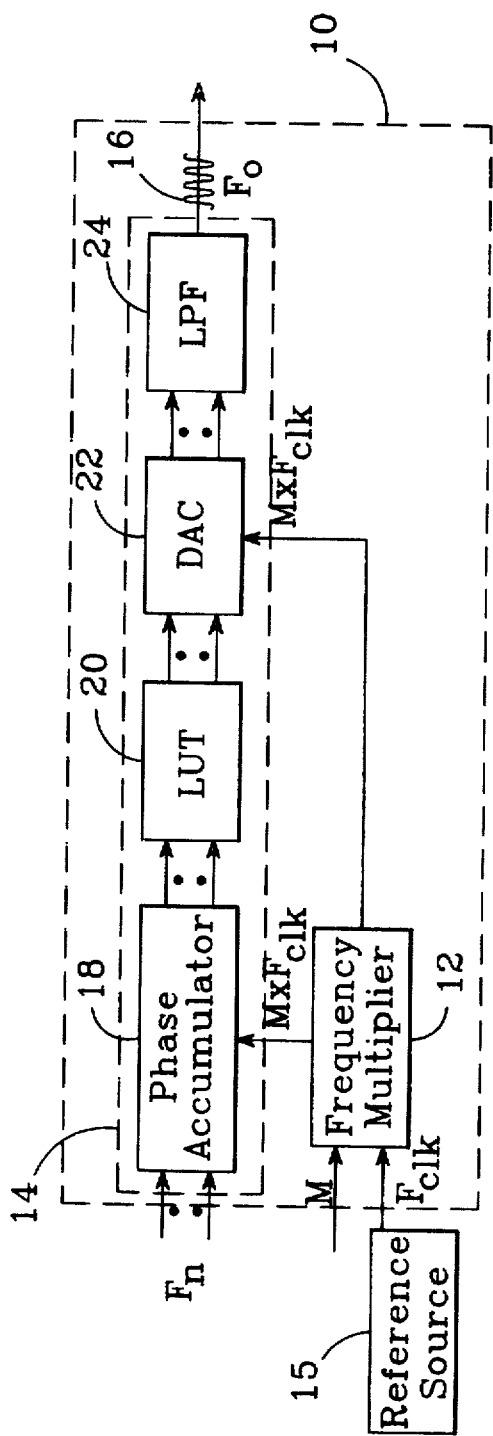
FIG. 1 is a simplified block diagram of a hybrid direct digital synthesizer incorporating a frequency multiplier circuit in accordance with the present invention.

As shown in FIG. 1, the present invention provides a hybrid DDS 10 that combines a programmable frequency multiplier 12 with a direct digital synthesizer 14. The dual-tunable DDS receives as inputs the N-bit tuning word $F_n$, a reference clock signal $F_{clk}$ from an external reference source 15, typically a stable crystal-controlled oscillator, and a multiplication factor M and outputs a periodic analog waveform 16 whose frequency $F_o$ is given by:

$$F_o = (F_n/2^N) \times (M \times F_{clk}) \qquad (2)$$

The multiplier 12 multiplies the frequency of the clock signal by the multiplication factor M to generate a DDS clock signal whose frequency is equal to $M*F_{clk}$. This extends the high end of the synthesizer's bandwidth while providing tuning flexibility that can be used to reduce the average power consumption and/or reduce the non-harmonic spur noise (SFDR) close to the waveform's fundamental frequency.

The synthesizer 14 includes a phase accumulator 18 whose step-size is set by the tuning word $F_n$. At each clock cycle, the accumulator output represents the instantaneous phase of the periodic analog waveform 16, and ramps up linearly at a rate proportional to the ratio $F_n/M \times F_{clk}$, wrapping around as it overflows the accumulator's range to generate a periodic phase signal. The rate at which the accumulator will overflow, and hence the waveform frequency, is proportional to the tuning word. The phase signal is then converted to a periodic digital waveform such as a sinewave, sawtooth, triangle or any other periodic signal either by direct computation or by using a look-up table (LUT) 20. A DAC 22 converts the digital waveform into the desired analog waveform, which is passed through a low pass filter 24 to remove the harmonics.

Figure 2:
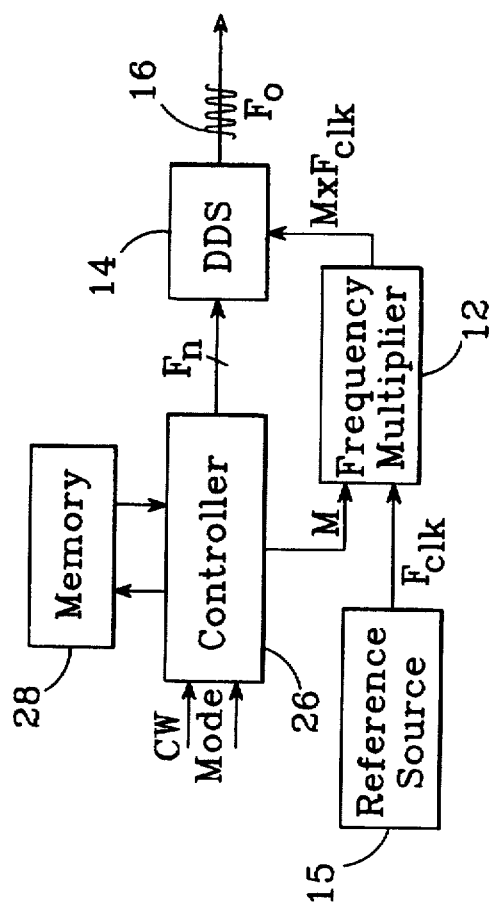
FIG. 2 illustrates an alternate embodiment of the hybrid DDS having a memory programmed with ($F_n$,M) pairs for the available waveform frequencies for at least one mode of operation.

In an alternate embodiment shown in FIG. 2, the dual-tunable DDS 10 includes a controller 26 and a memory 28, which is programmed with a set of $(F_n,M)$ pairs for the available waveform frequencies $F_o$ for at least one mode of operation and at least one reference clock frequency. Controller 26 reads out the $(F_n,M)$ pair corresponding to a particular frequency designated by a digital codeword (CW) and mode (MODE) and applies them to DDS 14 and frequency multiplier 12, respectively.

Three possible modes of operation include 1) SFDR optimization, 2) power minimization, and 3) a hybrid SFDR-power enhancement mode. To optimize SFDR performance, the $(F_n,M)$ pair that minimizes SFDR for a given waveform frequency is read out of memory 28 and input to DDS 14. To minimize power consumption, the $(F_n,M)$ pair providing the lowest DDS clock frequency $M*F_{clk}$ that satisfies the Nyquist criteria and shifts the aliased images and/or harmonically related spurs far enough away from the fundamental that they can be removed via filtering frequency is read out of memory 28 and input to DDS 14. To simultaneously improve SFDR performance and lower the DDS clock frequency, the $(F_n,M)$ pair having the smallest value for M that satisfies a SFDR criteria in that range is selected. Other criterion for selecting the $(F_n,M)$ pair for a desired waveform frequency such as frequency resolution can also be used.

The non-harmonic spurs that lie close to the fundamental waveform frequency $F_o$ are primarily caused by the DDS architecture, and specifically the finite quantization levels at the input to the DAC. For a given phase increment, the output code from the LUT is effectively rounded to the nearest available DAC code, which produces spurs at predictable frequencies. To a lesser degree, the resolution of the accumulator will also affect the amplitude of the spurs. DAC nonlinearities will also affect the amplitude of the spurs depending on the quality of the DAC implementation.

Figure 3:
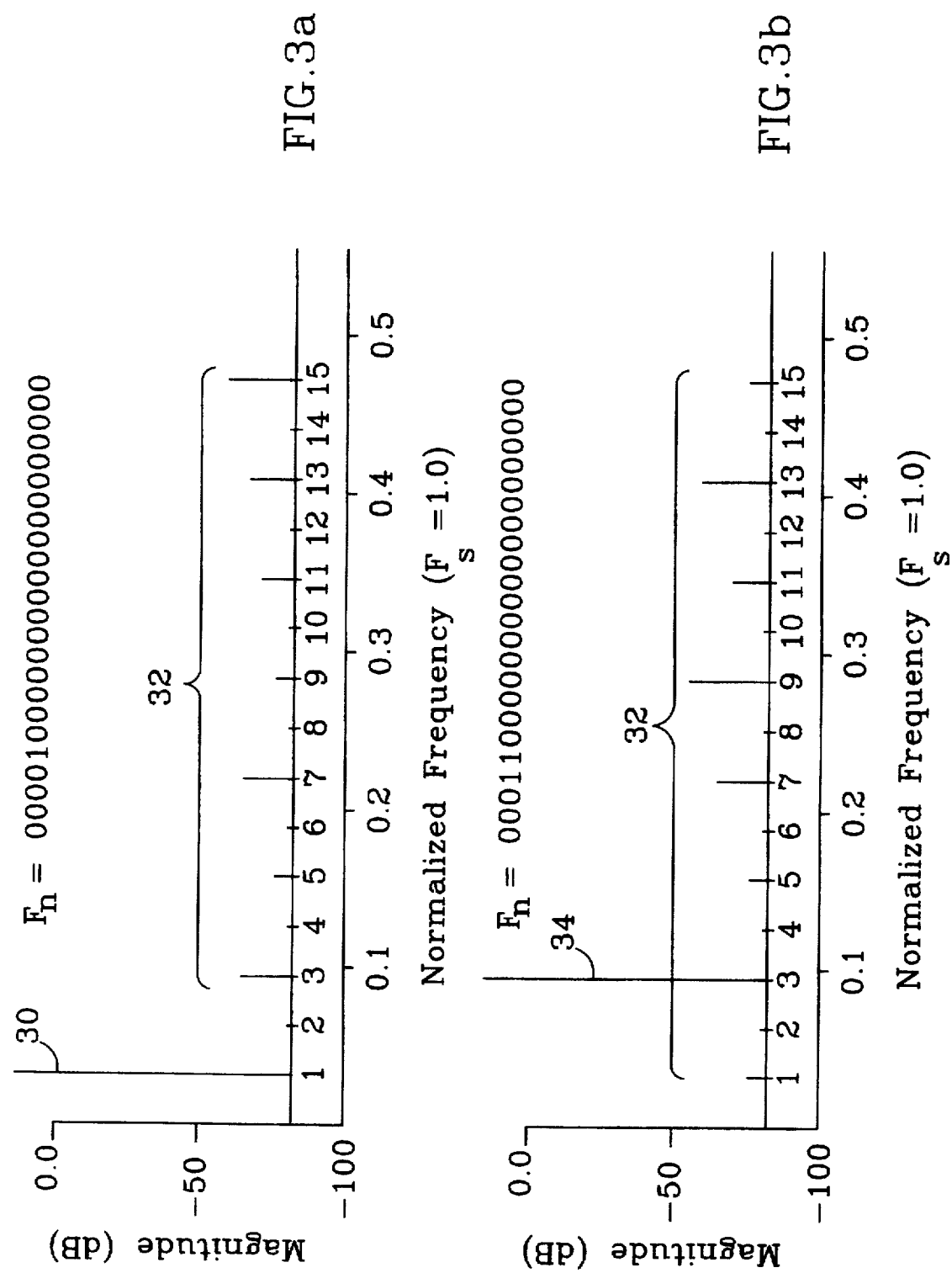
FIGS. 3a and 3b are frequency spectrum plots illustrating the spurs associated with the DDS process and the tuning capability of the present invention.

Based only upon the finite quantization level effects, the frequency spacing between the fundamental frequency $F_o$ and the spurs, as well as the spur-to-spur spacing, is equal to twice the waveform's fundamental frequency if just the least significant bit (LSB) of the tuning word $F_n$ is used as a separate tuning word. As shown in FIG. 3a, the single bit accumulating on itself scales the DDS clock by $2^r/2^N$ where r is the position of the selected LSB in the N accumulator bits, for example 00001000000000000000000, to produce the LSB fundamental frequency 30 and a corresponding set of spurs 32 when run through an FFT.

Any other tuning word, for example 00011000000000000000000 as shown in FIG. 3b, that uses this same r bit as its LSB will generate a higher fundamental frequency 34 and the same set of spurs 32 with their frequency positions in the set rearranged, or multiplied, by the tuning word-to-bit ratio. The spurs generated by the single bit tuning word are odd harmonics of the LSB fundamental, and thus for any tuning word the close-in spurs are twice the LSB frequency from the actual waveform fundamental frequency $F_o$. The amplitudes are also predictable given the spurious pattern of the LSB tuning word.

It follows that an N-bit tuning word has N different sets of spurs, one for each LSB position. Within each set, the spur locations and amplitudes vary depending upon the actual pattern of the phase errors related to the tuning word. Enhanced dynamic range bands in the synthesizer's frequency response correspond to the rearrangements where the small amplitude spurs are multiplied so that they are close to the fundamental waveform frequency and the larger amplitude spurs are spaced away from the fundamental. In general, these enhanced dynamic range bands, which correspond to a $(F_n,M)$ pair, can be identified for each waveform frequency either by simulating the DDS or by analyzing actual dual-tunable DDS ICs.

Figure 4:
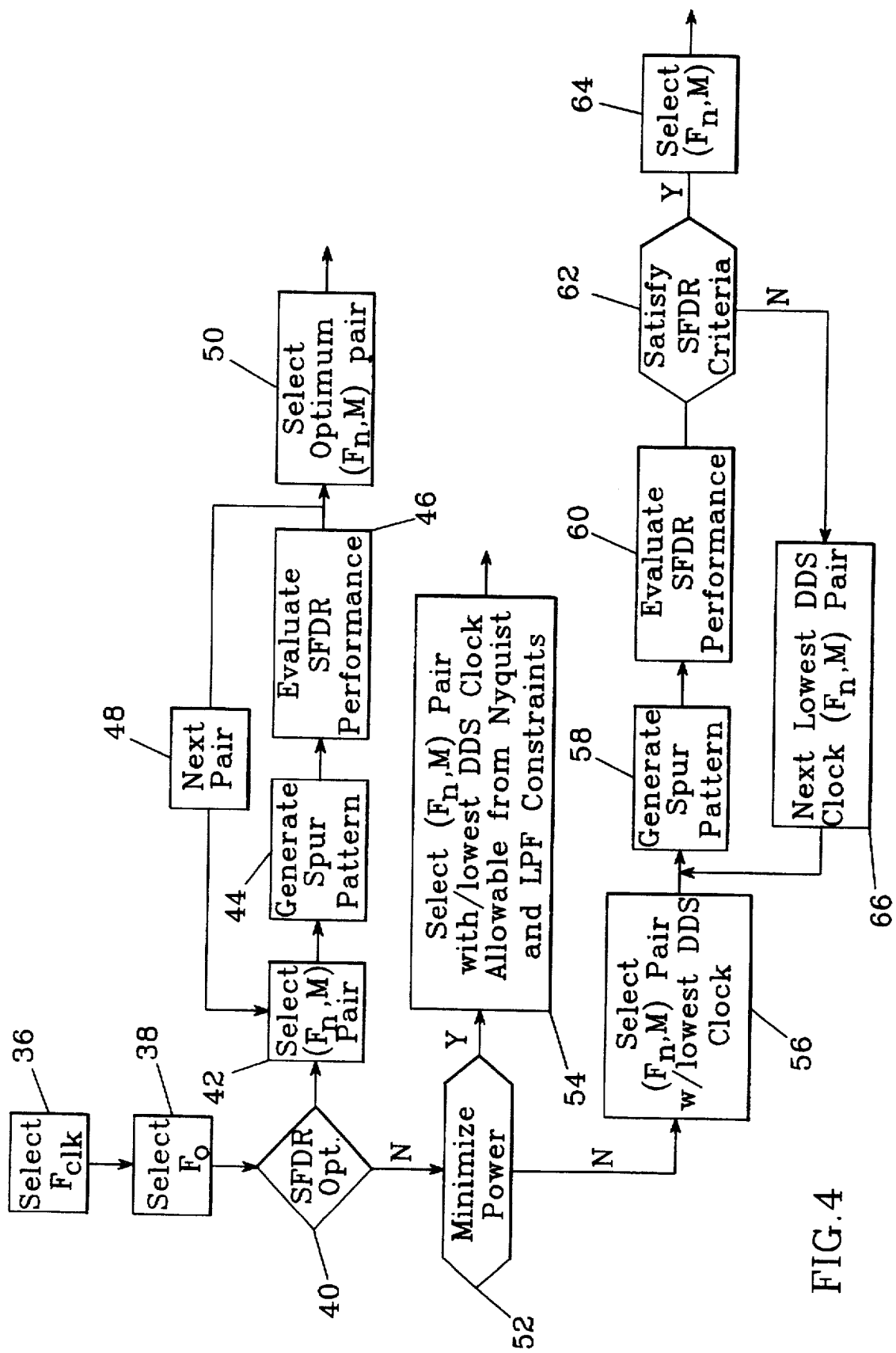
FIG. 4 is a flow chart illustrating a method of selecting ($F_n$,M) pairs for the different output frequencies to optimize SFDR performance, minimize power consumption, or improve both SFDR and power consumption.

As shown in FIG. 4, the $(F_n,M)$ pairs for SFDR, power, and hybrid SFDR-power modes are suitably generated off-line and then programmed into memory 28 shown in FIG. 2. The first step (step 36) is to select the frequency $F_{clk}$ of the external clock signal. This value will depend upon the desired frequency range of the periodic analog waveform and other design considerations. Furthermore, the memory may be programmed for a set of different fixed clock frequencies. In step 38, a desired waveform frequency $F_o$ is selected, suitably at either end of the desired frequency range. The following process is then repeated for each frequency in the range with a frequency resolution of $\frac{1}{2}^N$. Alternately, once a good tuning word $F_n$ is found the remaining $(F_n,M)$ pairs for the different output frequencies can be found by scaling the multiplication factor M.

If it is desired to optimize SFDR performance, i.e. MODE 1 (step 40), a first $(F_n,M)$ pair is selected that generates the desired waveform frequency $F_o$ at the selected clock frequency $F_{clk}$ (step 42). The corresponding spur pattern is generated (step 44) either analytically via simulation as described above or by testing an actual dual-tunable DDS IC. Simulation is faster and allows a designer to control the additional sources of error (DAC nonlinearity, accumulator error) whereas actual testing generates a real spur pattern for a given IC. SFDR performance is evaluated (step 46) based upon a selected criteria. For example, it may be the difference between the fundamental and the next largest spur in a narrow frequency band around the fundamental or the total power of the spurs in the narrow band. The next $(F_n,M)$ pair is selected (step 48) and steps 42, 44 and 46 are repeated until all pairs are exhausted. The best $(F_n,M)$ pair is selected (step 50) and programmed into the memory.

If minimum average power consumption is the goal, MODE 2 (step 52), the ($F_n$,M) pair with the lowest DDS clock M×$F_{clk}$ that satisfies the Nyquist criteria and the LPF constraints is selected (step 54). Otherwise, in MODE 3, the ($F_n$,M) pair having the lowest DDS clock that also satisfies an SFDR criteria is selected. This is accomplished by first selecting the ($F_n$,M) pair that would minimize power consumption (step 56). Thereafter, the corresponding spur pattern is generated (step 58) and evaluated for performance (step 60). If the selected pair satisfies the criteria (step 62), it is selected (step 64) and programmed into memory. Otherwise the next lowest DDS clock ($F_n$,M) pair is selected (step 66) and the process repeated until a conforming pair is identified.

The frequency multiplier can be implemented by various means such as standard phase-locked loop (PLL) techniques, which include classical linear, digital and fractional M techniques, as well as other forms of voltage controlled oscillators (VCOs) or current controlled oscillators (ICOs) based multipliers. These multipliers use negative feedback from the VCO/ICO output to generate digital or analog phase error signals, which are converted to control signals and, in turn, drive the VCO/ICO input. The multiplier's spurious noise performance should be at least as good, and preferably 20 dB better than the DDS spurious performance so that it is not a performance limiter. Known DPLL circuits are described by V. Manassevitsch, *Frequency Synthesizers Theory and Design*, Wiley Interscience 3$^{rd}$ Edition, pp. 31–33, 1987 and by Razavi, *Design of Monolithic Phase-Locked Loops and Clock Recovery Circuits—A Tutorial*, IEEE Press, pp. 1–7, 1996.

Figure 5:
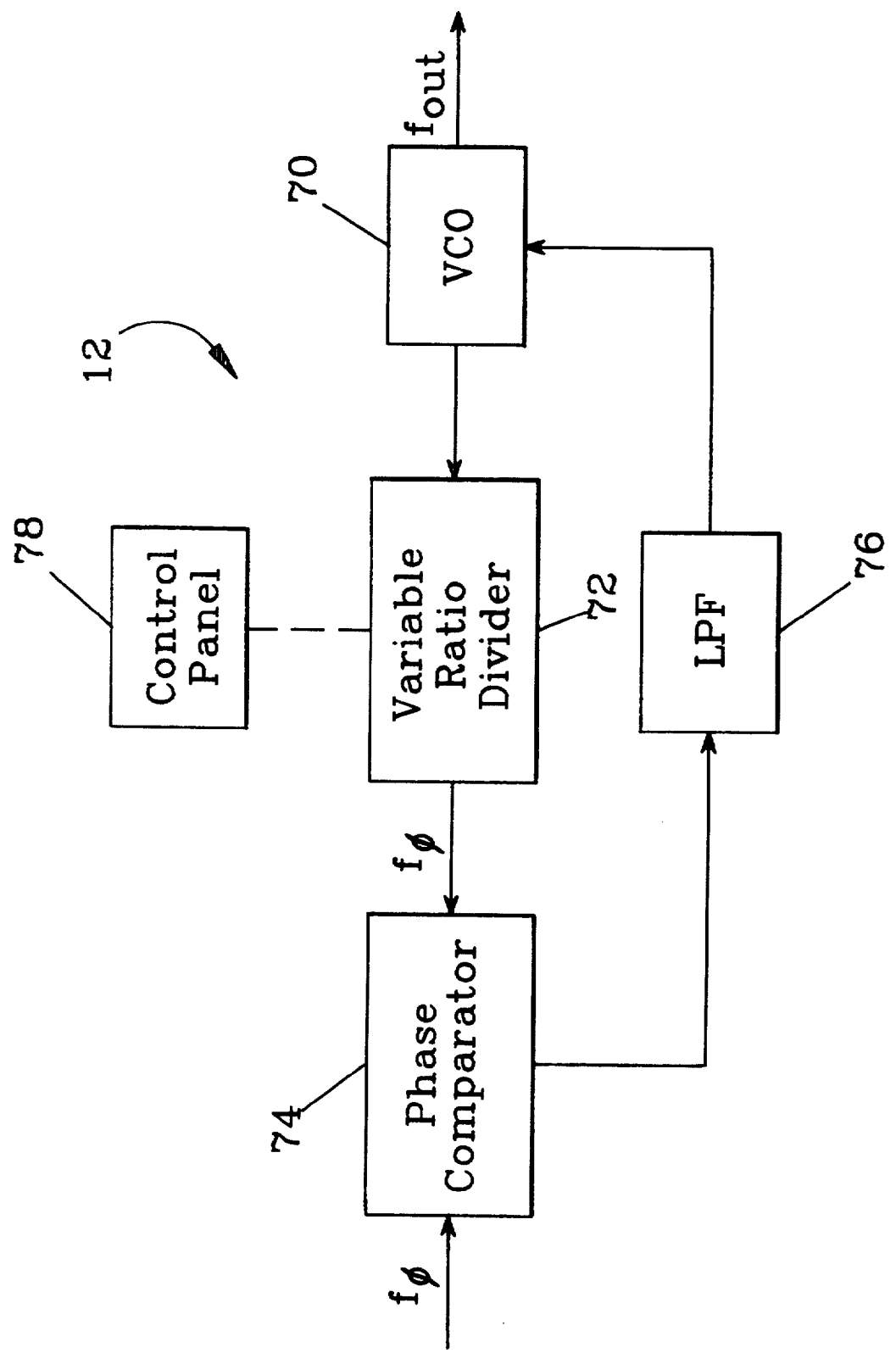
FIG. 5 is a schematic diagram of one embodiment of the frequency multiplier circuit shown in FIG. 1.

FIG. 5 illustrates a digital PLL (DPLL) embodiment of frequency multiplier 12. The loop comprises a VCO 70, variable-ratio (e.g., ratio of integers) frequency divider 72, a phase comparator 74, and a loop filter 76. The VCO output is divided and compared with a stable reference. Error voltage derived from the phase comparator maintain the VCO on frequency. Frequency selection is accomplished by a channel selector (control panel) 78, which varies the division ratio of the frequency divider. The DPLL locks on a frequency $f_{out}$=M$f_\phi$ where the smallest frequency increment generated by the loop is equal to the phase-comparator frequency $f_\phi$ and M is the divider ratio. In the present implementation, the phase-comparator frequency $f_\phi$ is provided by and equal to the clock signal $F_{clk}$ generated by the external reference source 15 shown in FIGS. 1 and 2. Thus, the multiplier's output frequency $f_{out}$ and, hence the DDS clock are equal to M*$F_{clk}$.

While several illustrative embodiments of the invention have been shown and described, numerous variations and alternate embodiments will occur to those skilled in the art. For example, this invention can also be implemented in a quadrature DDS configuration where the Sine and Cosine digital outputs are connected to other processing circuitry. Furthermore, the basic configuration can be implemented with or without an integrated DAC. Such variations and alternate embodiments are contemplated, and can be made without departing from the spirit and scope of the invention as defined in the appended claims.

We claim:

1. A synthesizer which responds to a clock signal $F_{clk}$ and a set of($F_n$, M) pairs by generating a corresponding set of output signals wherein $F_n$ is a digital tuning word that has N bits, a multiplication factor M is a ratio of integers and a respective output signal has a frequency $F_o$=($F_n/2^N$)×(M×$F_{clk}$), comprising:

a memory for storing said set of ($F_n$, M) pairs;

a controller that reads out a first selected ($F_n$, M) pair of said set of ($F_n$, M) pairs from said memory in response to a digital codeword;

a frequency multiplier that multiplies said clock signal $F_{clk}$ and the multiplication factor M of said selected ($F_n$, M) pair to generate a multiplied clock signal M×$F_{clk}$; and a direct digital synthesizer that responds to said multiplied clock signal M×$F_{clk}$ and the digital tuning word $F_n$ of said first selected ($F_n$, M) pair and generates said respective output signal having said frequency $F_o$=($F_n/2^N$)×(M×$F_{clk}$).

2. The synthesizer of claim 1, wherein said controller reads out a second selected ($F_n$, M) pair for providing a lowest multiplied clock signal M×$F_{clk}$ that reduces an average power consumed by said synthesizer.

3. The synthesizer of claim 1, wherein said controller reads out a second selected ($F_n$, M) pair for reducing spurious signals that are associated with said respective output signal.

4. The synthesizer of claim 1, wherein said controller reads out a second ($F_n$, M) pair for providing a lowest multiplied clock signal M×$F_{clk}$ that reduces the average power consumed by said synthesizer and reduces spurious signals that are associated with said respective output signal.

5. The synthesizer of claim 1, wherein said direct digital synthesizer, said frequency multiplier, said memory and said controller are integrated in an integrated circuit (IC) package.

6. The synthesizer of claim 1, wherein said direct digital synthesizer includes:

a phase accumulator that generates a periodic phase signal in response to said N-bit digital tuning word $F_n$ and said multiplied clock signal M×$F_{clk}$;

a look-up table for providing a digital waveform in response to said periodic phase signal;

a digital-to-analog converter that generates an analog waveform in response to said digital waveform; and a filter that processes said analog waveform.

7. The synthesizer of claim 1, wherein said multiplier includes:

a voltage-controlled oscillator which generates an oscillator signal whose frequency responds to a voltage signal at an oscillator input;

a frequency divider having a multiplication factor M selected by said controller, said frequency divider dividing said oscillator signal by said factor M to generate a divided oscillator signal;

a phase comparator which generates an error voltage in response to said clock signal $F_{clk}$ and said divided oscillator signal; and a low pass filter that couples said error voltage to said oscillator input;

said oscillator signal thereby controlled to form said multiplied clock signal M×$F_{clk}$.

8. A synthesizer which responds to a clock signal $F_{clk}$ and a set of ($F_n$, M) pairs by generating a corresponding set of output signals wherein $F_n$ is a digital tuning word that has N bits bits, a multiplication factor M is a ratio of integers and a respective output signal has a frequency $F_o$=($F_n/2^N$)×(M×$F_{clk}$), comprising:

a memory for storing said set of ($F_n$, M) pairs;

a controller that reads out a first selected ($F_n$, M) pair of said set of ($F_n$, M) pairs from said memory in response to a digital codeword;

a phase-locked loop frequency multiplier that multiplies said clock signal $F_{clk}$ and the multiplication factor M of said first selected ($F_n$,M) pair to generate a multiplied clock signal $M \times F_{clk}$; and a direct digital synthesizer that responds to said multiplied clock signal $M \times F_{clk}$ and the digital tuning word $F_n$ of said first selected ($F_n$, M) pair and generates said respective output signal having said frequency $F_o = (F_n/2^N) \times (M \times F_{clk}$.

9. The synthesizer of claim 8, wherein said direct digital synthesizer, said phase-locked loop frequency multiplier, said memory and said controller are integrated in an integrated circuit (IC) package.

10. The synthesizer of claim 8, wherein said direct digital synthesizer includes:

a phase accumulator that generates a periodic phase signal in response to said N-bit digital tuning word $F_n$ and said multiplied clock signal $M \times F_{clk}$;

a look-up table for providing a digital waveform in response to said periodic phase signal;

a digital-to-analog converter that generates an analog waveform in response to said digital waveform; and a filter that processes said analog waveform.

11. The synthesizer of claim 8, wherein said phase-locked loop multiplier includes:

a voltage-controlled oscillator which generates an oscillator signal whose frequency responds to a voltage signal at an oscillator input;

a frequency divider having a multiplication factor M selected by said controller, said frequency divider dividing said oscillator signal by said factor M to generate a divided oscillator signal;

a phase comparator which generates an error voltage in response to said clock signal $F_{clk}$ and said divided oscillator signal; and a low pass filter that couples said error voltage to said oscillator input;

said oscillator signal thereby controlled to form said multiplied clock signal $M \times F_{clk}$.

12. A method of generating a set of output signals in response to a clock signal $F_{clk}$ and a corresponding set of ($F_n$,M) pairs wherein $F_n$ is a digital tuning word that has N bits, a multiplication factor M is a ratio of integers and a respective output signal has a frequency $F_o = (F_n/2^N) \times (M \times F_{clk})$, the method comprising:

storing said set of ($F_n$, M) pairs;

reading out a first selected ($F_n$, M) pair in response to a digital codeword;

multiplying said clock signal $F_{clk}$ and the multiplication factor M of said first selected ($F_n$, M) pair to produce a multiplied clock signal $M \times F_{clk}$;

in response to said multiplied clock signal $M \times F_{clk}$ and the digital tuning word $F_n$ of said first selected ($F_n$, M) pair, synthesizing said respective output signal having said frequency $F_o = (F_n/2^N) \times (M \times F_{clk})$.

13. The method of claim 12, wherein said reading step includes the step of choosing a second selected ($F_n$, M) pair that provides a lowest multiplied clock signal $M \times F_{clk}$ that reduces an average consumed power.

14. The method of claim 12, wherein said reading step includes the step of choosing a second selected ($F_n$, M) pair that reduces spurious signals associated with said respective output signal.

15. The method of claim 12, wherein said synthesizing step includes the step of converting a phase signal generated from a phase accumulator to a digital waveform by use of a look-up table.

16. The method of claim 12, wherein said storing, reading, multiplying and synthesizing steps are respectively realized with a memory, a controller, a phase-locked loop frequency multiplier and a direct digital synthesizer.

* * * * *